US011051422B2

(12) United States Patent
Norton et al.

(10) Patent No.: US 11,051,422 B2
(45) Date of Patent: Jun. 29, 2021

(54) MODULAR SERVER DESIGN

(71) Applicant: HEWLETT PACKARD ENTERPRISE DEVELOPMENT LP, Houston, TX (US)

(72) Inventors: John Norton, Houston, TX (US); David W. Engler, Cypress, TX (US); Hermann Wienchol, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/131,441

(22) Filed: Sep. 14, 2018

(65) Prior Publication Data

US 2020/0093021 A1    Mar. 19, 2020

(51) Int. Cl.
*H05K 7/14* (2006.01)
*G02B 6/42* (2006.01)

(52) U.S. Cl.
CPC ......... *H05K 7/1489* (2013.01); *G02B 6/4278* (2013.01); *H05K 7/1498* (2013.01)

(58) Field of Classification Search
CPC ..... G06F 1/187; G06F 11/261; H05K 7/1487; H05K 7/1492; H05K 7/20727; H05K 7/1489; H05K 7/1498; G02B 6/4278
See application file for complete search history.

(56) References Cited

U.S. PATENT DOCUMENTS

| 6,005,770 A  | * 12/1999 | Schmitt | ................ H05K 7/2019 |
| | | | 361/679.48 |
| 6,950,895 B2 | 9/2005 | Bottom | |
| 7,138,733 B2 | 11/2006 | Sanders | |
| 7,755,881 B2 | 7/2010 | Bottom et al. | |
| 2002/0145847 A1 | * 10/2002 | Crosby | ................. F16M 11/10 |
| | | | 361/679.02 |
| 2012/0005392 A1 | 1/2012 | Yagi | |
| 2012/0033370 A1 | 2/2012 | Karl et al. | |
| 2015/0180578 A1 | * 6/2015 | Leigh | .................. G02B 6/4284 |
| | | | 398/135 |
| 2015/0286601 A1 | * 10/2015 | Buckland | ............ G06F 13/4221 |
| | | | 710/300 |

(Continued)

FOREIGN PATENT DOCUMENTS

| CN | 105208817 A | * 12/2015 |
| CN | 105208817 A | 8/2018 |

OTHER PUBLICATIONS

UserBenchmark, "User guide: Test, fix and upgrade your PC's performance", <https://web.archive.org/web/20180225085135/https://www.userbenchmark.com/page/guide>, Feb. 25, 2018, 11 pages. (Year: 2018).*

(Continued)

*Primary Examiner* — James Wu
(74) *Attorney, Agent, or Firm* — Nolte Lackenbach Siegel

(57) ABSTRACT

A modular compute platform including an enclosure, a first module including an application specific integrated circuit, the first module being disposed in the enclosure, a second module including an input/output device, the second module being disposed in the enclosure, the input/output device connected to the first module through a first cable, and a third module including a media device disposed in the enclosure, the media device connected to the first module through a second cable.

18 Claims, 8 Drawing Sheets

(56) References Cited

U.S. PATENT DOCUMENTS

| | | | | |
|---|---|---|---|---|
| 2016/0179723 A1* | 6/2016 | Kishi | ................. | G06F 13/4068 |
| | | | | 710/113 |
| 2016/0255740 A1* | 9/2016 | Ping | ..................... | G06F 13/362 |
| | | | | 710/301 |
| 2018/0335576 A1* | 11/2018 | Farbert | .................... | G02B 6/43 |

OTHER PUBLICATIONS

Michael Brundridge, Dell Modular Server Enclosure and I/O Modules, Aug. 2005, <http://www.dell.com/downloads/global/power/ps3q05-20050163-Brundridge-OE.pdf >.

Partial European Search Report received for EP Patent Application No. 19195902.2, dated Feb. 14, 2020, 13 pages.

Uwe V. D. Weyden, "Notebook Kick-Off with Asus L8400B", available online at <https://web.archive.org/web/20081102083442/http://www.tomsguide.com/us/notebook-kick,review-16.html>, Feb. 2, 2001, 3 pages.

Extended European Search Report received for EP Patent Application No. 19195902.2, dated May 20, 2020, 13 pages.

UserBenchmark, "User guide: Test, fix and upgrade your PC's performance", available online at <https://web.archive.org/web/20180225085135/https://www.userbenchmark.com/page/guide>, Feb. 25, 2018, 11 pages.

* cited by examiner

MODULAR SERVER DESIGN

BACKGROUND

Increasingly complex computer infrastructure is commonly used to perform computing tasks. Data centers are often used to host this computing infrastructure. Such data centers may include various electronic devices that make up the computing infrastructure. Examples of electronic devices include compute platforms, such as servers, that may be used to process data. During the lifespan of compute platforms, the compute platforms may require repair to correct device failures, as well as require hardware updates to incorporate emerging technology.

DETAILED DESCRIPTION

Figure 1:
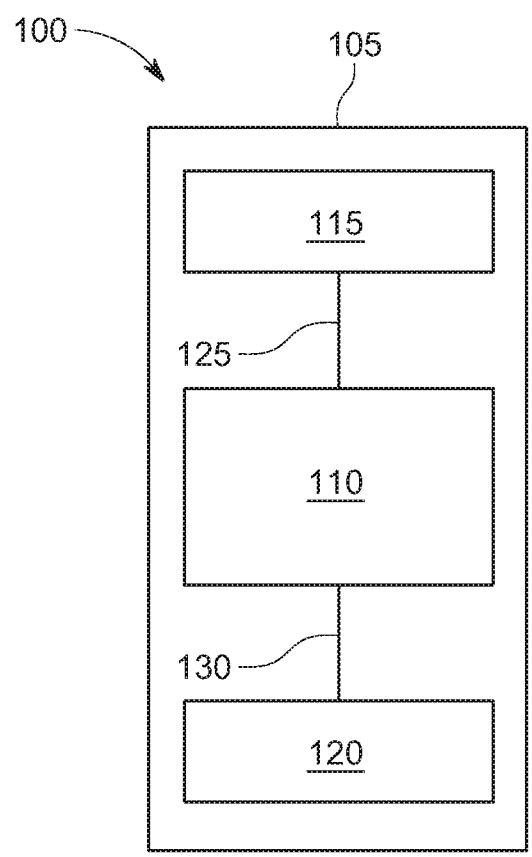
FIG. 1 is a schematic representation of a modular compute platform in accordance with one or more example embodiments.

One or more examples are described in detail with reference to the accompanying figures. For consistency, like elements in the various figures are denoted by like reference numerals. In the following detailed description, specific details are set forth in order to provide a thorough understanding of the subject matter claimed below. In other instances, well-known features to one of ordinary skill in the art having the benefit of this disclosure are not described to avoid obscuring the description of the claimed subject matter.

Compute platforms, such as servers, are designed to include components that are housed in an enclosure, which may then be loaded within one or more racks. The compute platform may include various components such as processors, memory, media, management, and input/output devices. During design and production, the components may be disposed on a printed circuit board and connected electrically through traces. Thus, the printed circuit board, through the traces, allow signals and power to be routed between the individual components.

Such printed circuit boards are used extensively throughout various electronic products. As signal speed requirements for various applications increase, the need to decrease signal power loss, or the loss of signal power and crosstalk, interference between signals, as components are added to a circuit becomes a limitation in printed circuit board design.

Signal frequency is another factor in insertion loss. As frequency increases, signal power losses increase, and signal integrity is negatively impacted, thereby making longer trace lengths in certain components impracticable. For example, new generations of the peripheral component interconnect express ("PCIE") standard, have speeds that will reach the 16 Ghz level. In order to maintain required signal strength, additional components, such as re-timers are being used. However, the added power, latency, and cost of such infrastructure makes the long-term viability of the solution untenable.

Implementations of the present disclosure may provide modular compute platform designs that allow components in a compute platform to be connected using cables instead of traces in the printed circuit board. Cables typically reduce signal power losses by an order of magnitude when compared to printed circuit board traces. By removing long traces in printed circuit boards, higher signal speeds may be achieved while not incurring signal power loss associated with such traces. Such implementations may separate the processing and memory components from input/output components and media components. As the different components are separated into individual modules, which will be described in detail below, the modules and/or individual components within the modules may be changed without having to replace the entire compute platform. Because modules or components within modules may be changed or replaced, the compute platform may be modified in response to improvements in technology or because of damaged components.

Modular compute platforms having replaceable modules, as well as methods for exchanging, compute platform components and optimizing compute platform design are discussed in detail below.

Turning to FIG. 1, a schematic representation of a modular compute platform according to an example embodiment is shown from a planar, top view. Modular compute platform 100 may include an enclosure 105 that is used to house various modules. In this implementation, a first module 110 may be disposed within enclosure 105. The first module 110 may be an application specific integrated circuit ("ASIC"). Examples of ASIC's may include central processing units, buggers, switches, retimers, and the like. As such, first module 110 may include a printed circuit board having at least a memory element. First module may also include a processor such as a CPU or system on chip ("SOC"). In certain implementations, the first module 110 may include more than one processor and more than one memory element. Examples of processors may include processors commercially available from, for example, Intel Corporation, Advanced Micro Devices, Inc., ARM Holdings, IBM, and others. Examples of types of memory may include synchronous dynamic random-access memory ("SDRAM"), double data rate synchronous dynamic random-access memory ("DDR DRAM"), Flash memory, resistive random-access memory ("re-RAM"), as well as other types of memory used in compute platforms.

Modular compute platform 100 may further include a second module 115. Second module 115 may include various management and input/output devices. Examples of management devices may include base management controllers and interfaces to management networks. Examples of input/output devices may include PCIE devices such as graphics adapter cards, network interface cards, and other peripheral devices. Second module 115 may further include other components, such as optical connectors, data storage devices, video devices, audio devices, and the like.

Modular compute platform 100 may also include a third module 120. Third module 120 may include various media devices. Examples of media devices may include hard drives, SSDs, memory devices, I/O devices, FPGA accelerators, GPUs in form factors such as 2.5" Drives, 3.5" drives, EDSFF standard modules (1U long, 1U short, 3"), and/or other standard drives, such as SAS, SATA, etc. In certain implementations, more than one type of storage device may be included in third module 120.

First module 110, second module 115, and third module 120 are physically separated. Thus, the components thereof are not disposed on the same printed circuit board and are not directly connected using traces. Rather, first module 110 is connected to second module 115 using a first cable 125. Similarly, first module 110 is connected to third module 120 using a second cable 130. Cables 125, 130 may be any type of cable 125, 130 capable of connecting the modules and transferring data there between.

Figure 2:
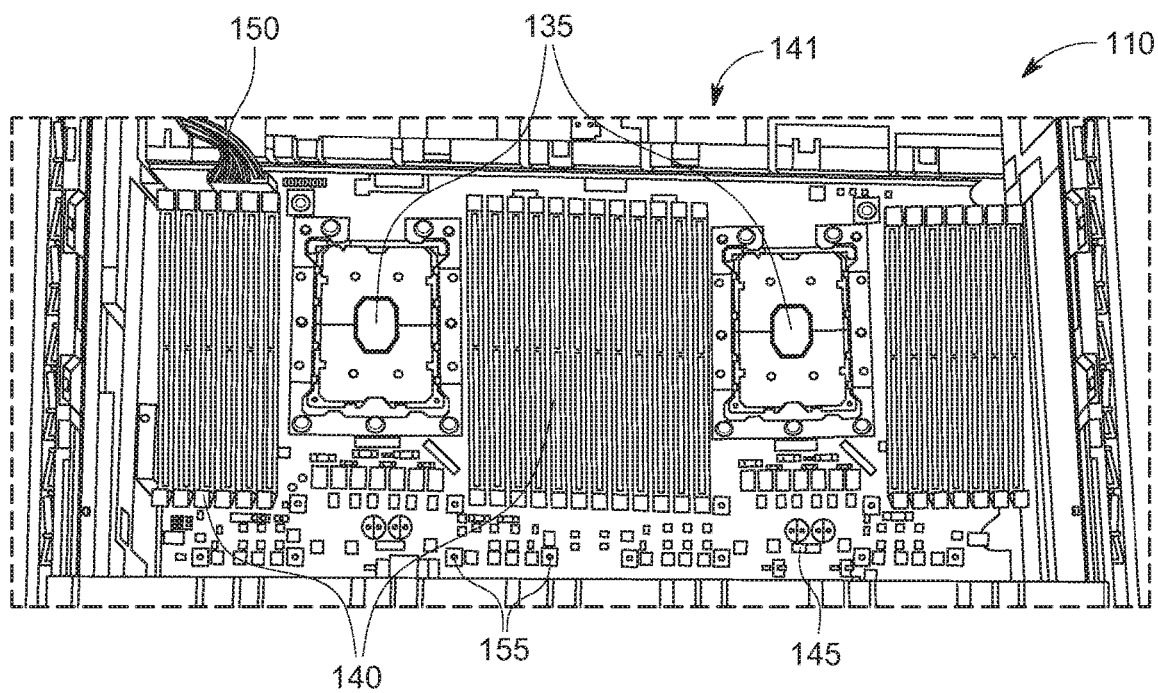
FIG. 2 is a top view of an interchangeable first module of a modular compute platform with a central processing unit ("CPU") in in accordance with one or more example embodiments.
Figure 3:
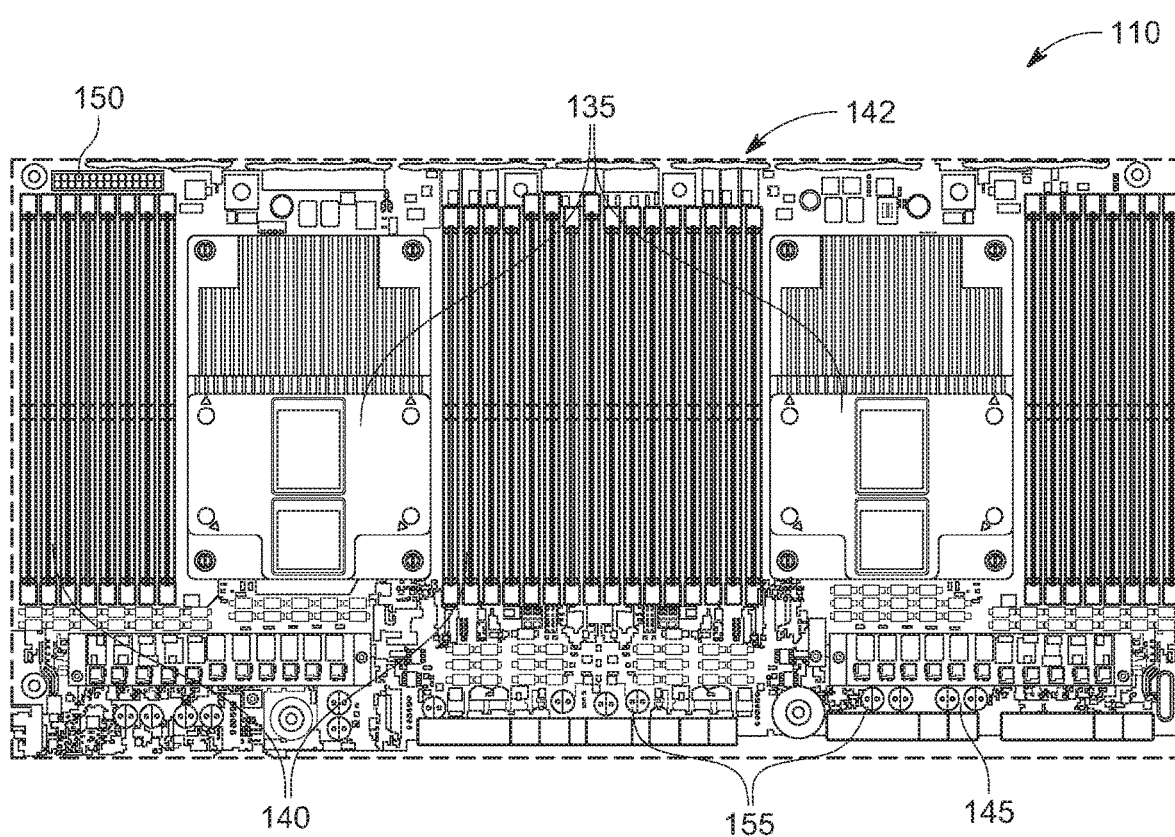
FIG. 3 is a top view of an interchangeable first module of a modular compute platform with a different CPU type than the CPU type shown in FIG. 2 in accordance with one or more example embodiments.

Referring to FIGS. 2 and 3 together, interchangeable first modules 110 of a modular compute platform 100 according to an example embodiment is shown from a top view. Both first modules 110 include two processors 135 and multiple memory slots 140 disposed on a printed circuit board 145. The combination of the processors and memory (not shown) define the first module 110 processing subsystem. First modules 110 further include common connector locations 150 and mounting points 155. While the actual components, as well as the physical layout of the components may vary, the common connector locations 150 and mounting points 155 may allow the first modules 110 to be interchangeable. In other implementations, first module 110 may include or exclude certain components. For example, in certain implementations first module 110 may be a central processing unit, a buffer, a switch, a retimer, or other computing components having one or more ASIC's 141, 142, as described above with respect to FIG. 1.

In certain implementations a compute platform may include a first module 110 that has a processing subsystem that is no longer functioning as desired. For example, a processing subsystem may have a damaged component or outdated technology. In other implementations a processing subsystem may be migrated between processing architecture of different subsystem component manufacturers. Because the first modules 110 have the same connector locations 150 and mounting points 155, first module 110 may be replaced individually rather than replacing the entire compute platform. The newly installed first module 110 may then be connected to second module 115 and third module 120 by cables 125, 130, thereby allowing the processing subsystem to be replaced without replacing input/output devices, media devices, and the like.

Figure 4:
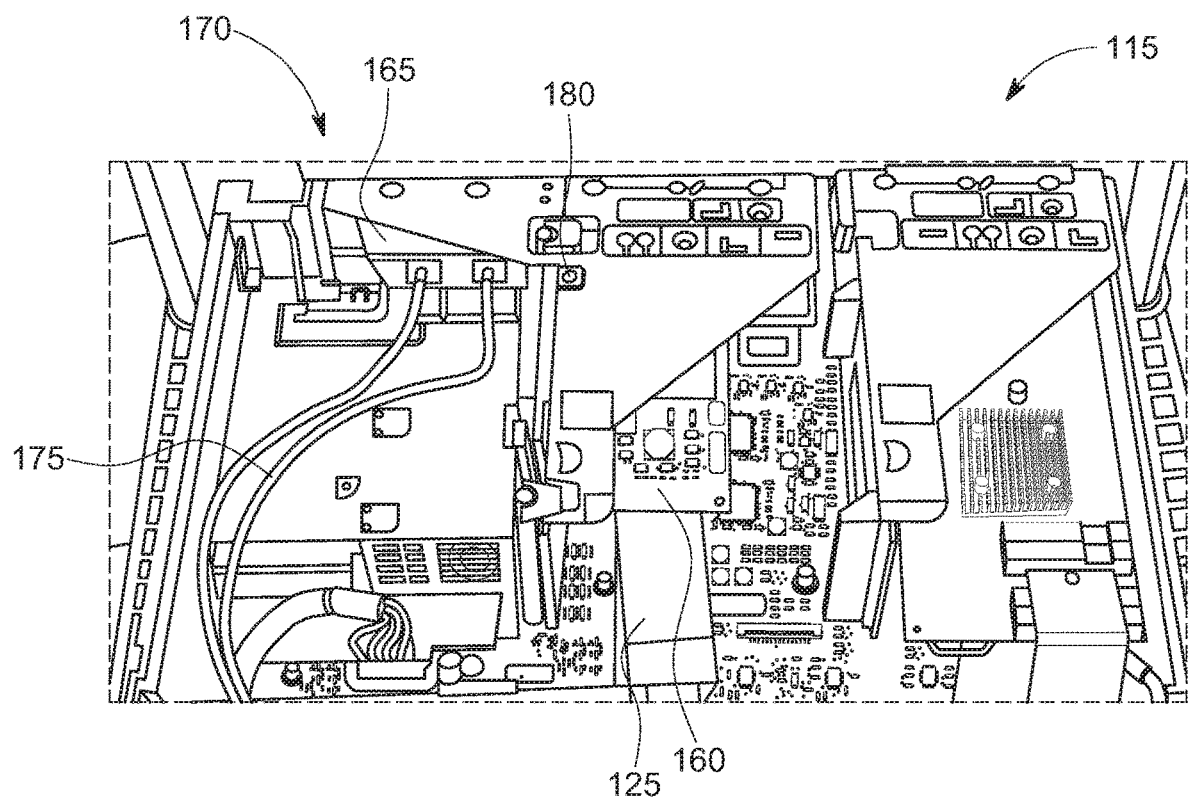
FIG. 4 is an elevated perspective view of a second module of a modular compute platform in accordance with one or more example embodiments.
Figure 5:
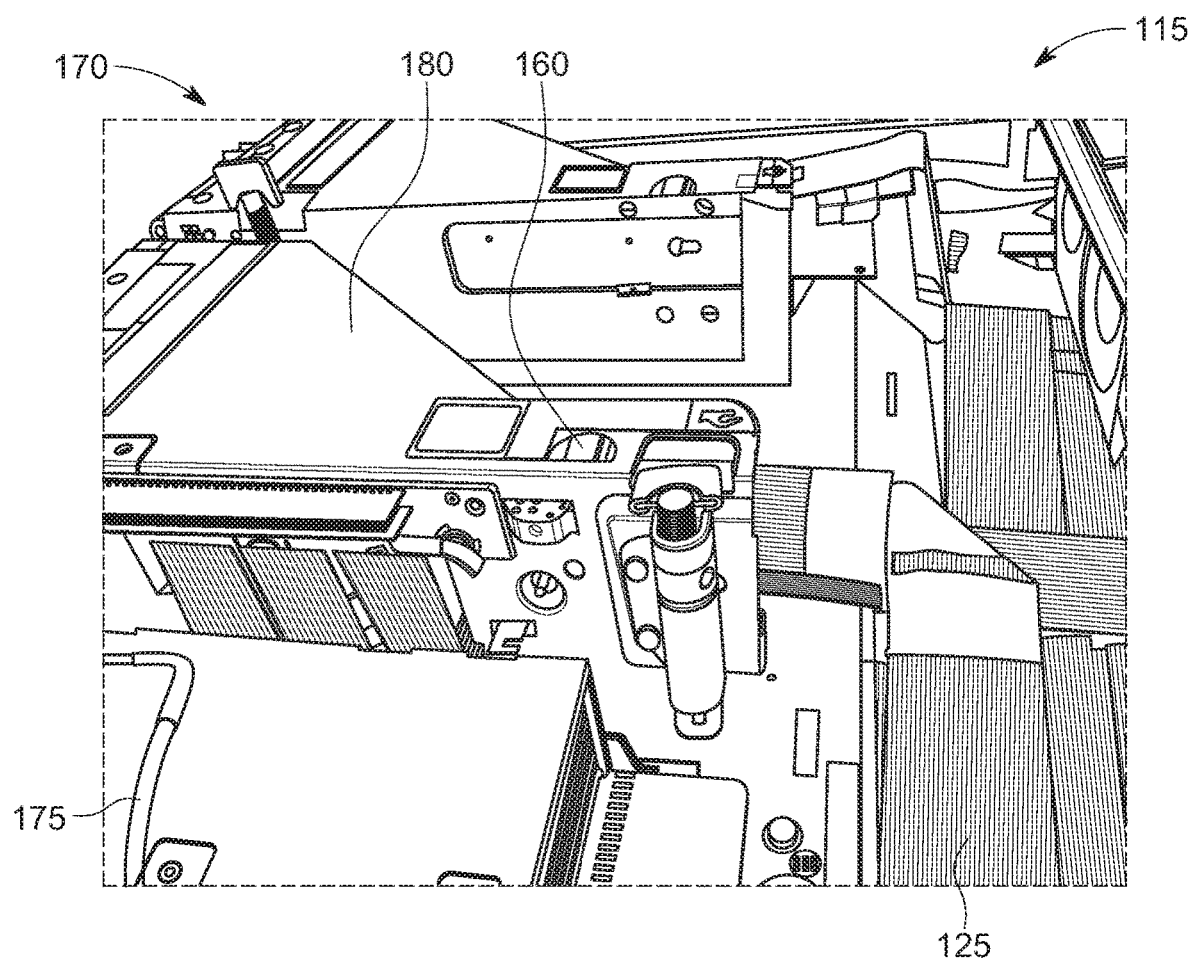
FIG. 5 is a side perspective view of a second module in accordance with one or more example embodiments.

Referring to FIGS. 4 and 5 together, an elevated perspective view and a side perspective view, respectively, of a second module 115 of a modular compute platform according to an example embodiment is shown. Second module 115 may include input/output components such as a PCIE device 160, an optical connector 165, data storage devices, video devices, audio devices, and the like. The optical connector 165 is attached to an optical cable routed from optical transceiver 220 in FIG. 7.

In this implementation, PCIE device 160 is connected to the first module (110 of FIGS. 2 and 3) through a cable 125. As discussed above, cable 125 may include any type of cable 125 that is capable of transferring data and/or power therebetween. As illustrated, cables 125 may be relatively flat and folded throughout second module 115, thereby maximizing space for airflow.

Also, in this implementation, optical connector 165 may be disposed on an outer edge 170 of second module 115 and/or enclosure 105, thereby providing a user external access to optical connector 165. Optical connector 165 may be connected to the first module (110 of FIGS. 2 and 3) through an optical cable 175 to optical transceiver (220 of FIG. 7). As will be discussed below, optical cable 175 may provide a direct or indirect connection between the processing subsystem of the first module and the optical transceiver (220 of FIG. 7), thereby allowing a user access to the processing subsystem.

Second module 115 may further include one, or more risers 180 that provide mechanical support for mounting various devices. Those of skill in the art having benefit of the present disclosure will appreciate that, the layout and orientation of components in second module 115 may vary based on design requirements and/or limitations. Additionally, the number and type of components disposed in second module 120 may be adjusted to meet the requirements for a particular implementation.

Figure 6:
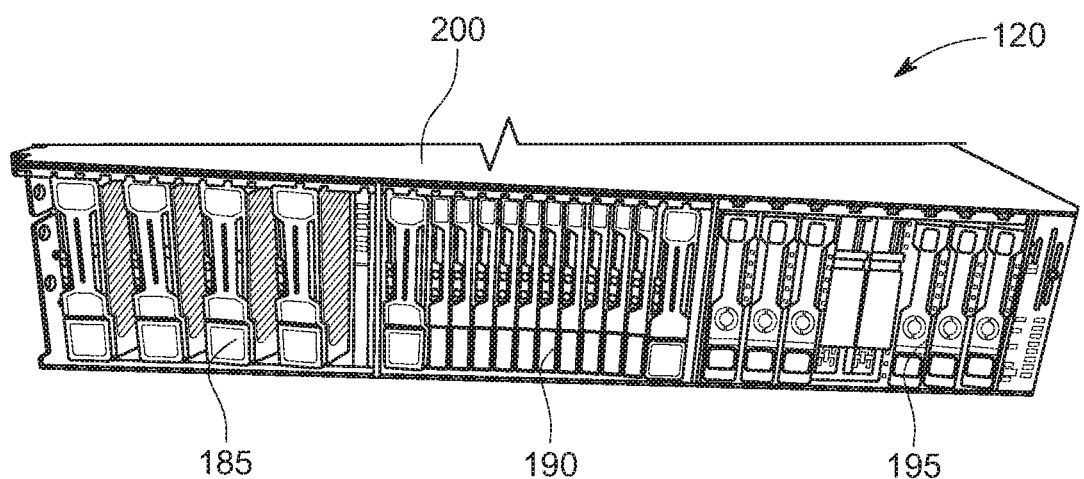
FIG. 6 is an end view of a third module in accordance with one or more example embodiments.

Referring to FIG. 6, a third module 120 of a modular compute platform according to an example embodiment is shown from an end view. As previously discussed, third module 120 may include various media devices 185, 190, 195. Examples of media devices 185, 190, 195 may include hard drives, SSDs, memory devices, I/O devices, FPGA accelerators, GPUs in form factors such as 2.5" Drives, 3.5" drives, EDSFF standard modules (1U long, 1U short, 3"), and/or other standard drives, such as SAS, SATA, etc. In certain implementations, more than one type of storage devices may be included in third module 120.

In certain implementations, the media devices 185, 190, 195 may be secured in place using mounting hardware 200. Depending on the requirements of the compute platform, the number and type of media devices 185, 190, 195, as well as the orientation and connectivity of media devices 185, 190, 195 may be varied.

Figure 7:
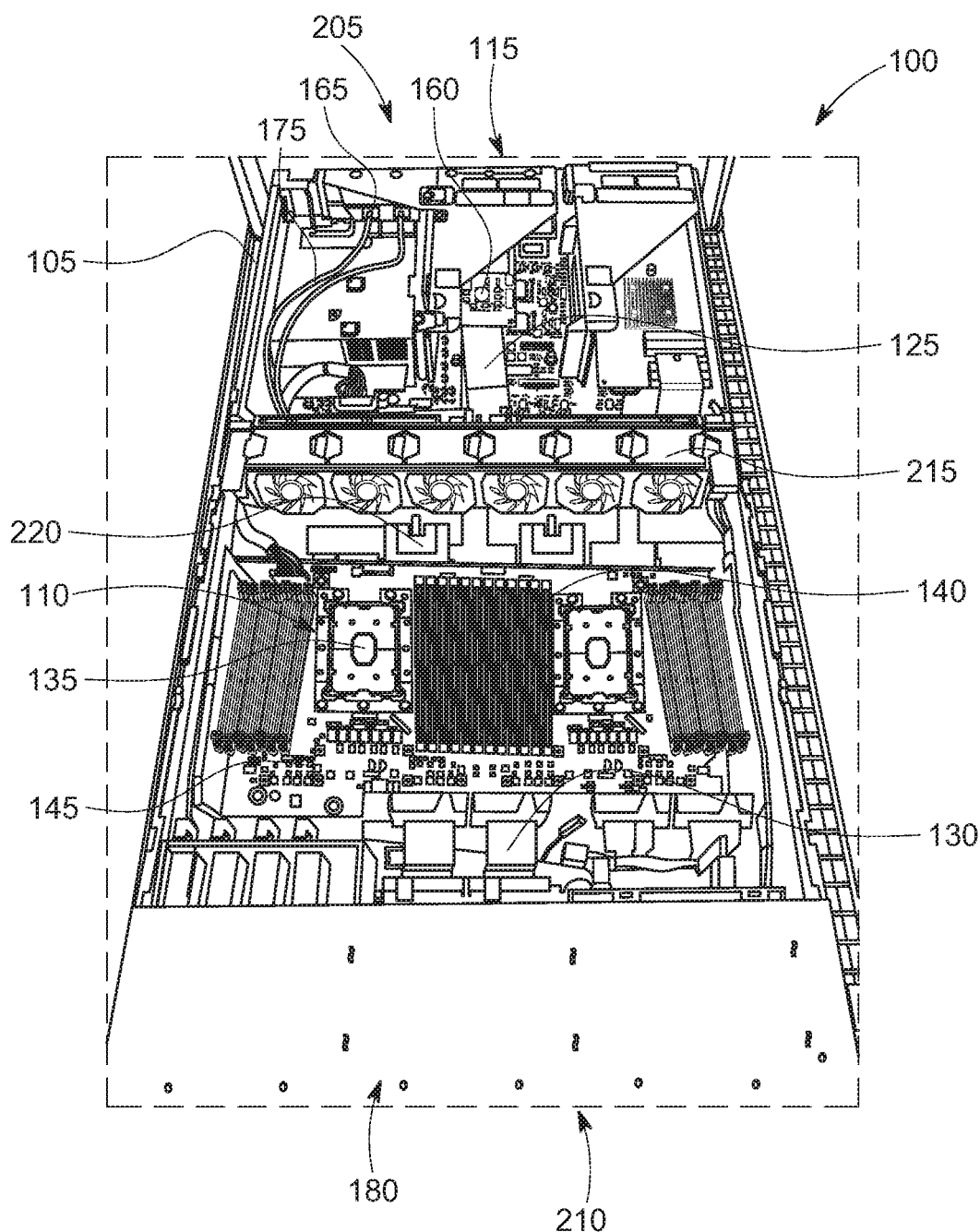
FIG. 7 is an elevated perspective view of a modular compute platform in accordance with one or more example embodiments.

Referring to FIG. 7, a modular compute platform 100 according to an example embodiment is shown from an elevated perspective view. In this implementation, the modules discussed above are illustrated in a complete compute platform 100. Specifically, first module 110 is shown disposed in a central location of enclosure 105. Second module 115 is disposed at a distal location 205 within enclosure 105 and third module 120 is disposed at a proximate location 210 within enclosure 105. The orientation of first, second, and third modules 110, 115, and 120, may be disposed within enclosure 105 in different locations. For example, first module 110 may be disposed at a proximate location 210 or distal location 205, second module 115 may be disposed at a central location or proximate location 210, and/or third module 120 may be disposed at a central location or distal location 205.

First module 110 may be connected to various components of second module 115 and third module 120 through cables, such as first cable 125 and second cable 130. Using cables 125, 130 to connect the processing subsystem of first module 110 with components of second module 115 and third module 120 allows first module 110 to be physically separated from components of second module 115 and third module 120. For example, first module 110 includes processors 135 and memory slots 140 disposed on a printed circuit board 145. Rather than connect additional components of second module 115 and third module 120 on printed circuit board 145 through traces, each component is connected to first module 110 through cables 125, 130.

Compute platform 100 may also include other components not specifically discussed above. For example, one or more fans 215 or other cooling devices may be disposed within enclosure 105 to provide airflow to cool compute platform 100 components. In certain implementations the optical connector 165 may be coupled to an optical transceiver 220 through optical cable 175. Optical transceiver 220 may then be connected to one or electrical connectors (not independently shown) providing connectivity between optical transceiver 220 and first module 110, thereby providing a user an optical connection to the processing subsystem from outside enclosure 105. One or more optical transceivers 220 may be connected to the electrical connectors on first module 110. In typical implementations, optical transceivers are connected in the back of the compute platform 100. By disposing optical transceivers 220 adjacent first module 110, optical transceiver 220 may be cooled more efficiently, system cost may be decreased, and configurability of the compute platform 100 having an optically enabled network may be enhanced.

During operation, first module 110 may become damaged or otherwise require replacement or repair. Rather than replace entire compute platform 100, a user may detach first module 110 from enclosure 105 and then install a different first module 110. Similarly, in order to improve the speed or other functionality of a management or input/output device, such as PCIE device 160, a user may remove the PCIE device 160 from second module 115. Rather than replace the entire compute platform 100, the user may install a new PCIE device 160, which may have higher speed capabilities. Similarly, a user may add new devices without having to replace the entire compute platform. Accordingly, compute platform 100 may be updated with new technology without having to replace components of the compute platform 100 that do not require replacement.

Figure 8:
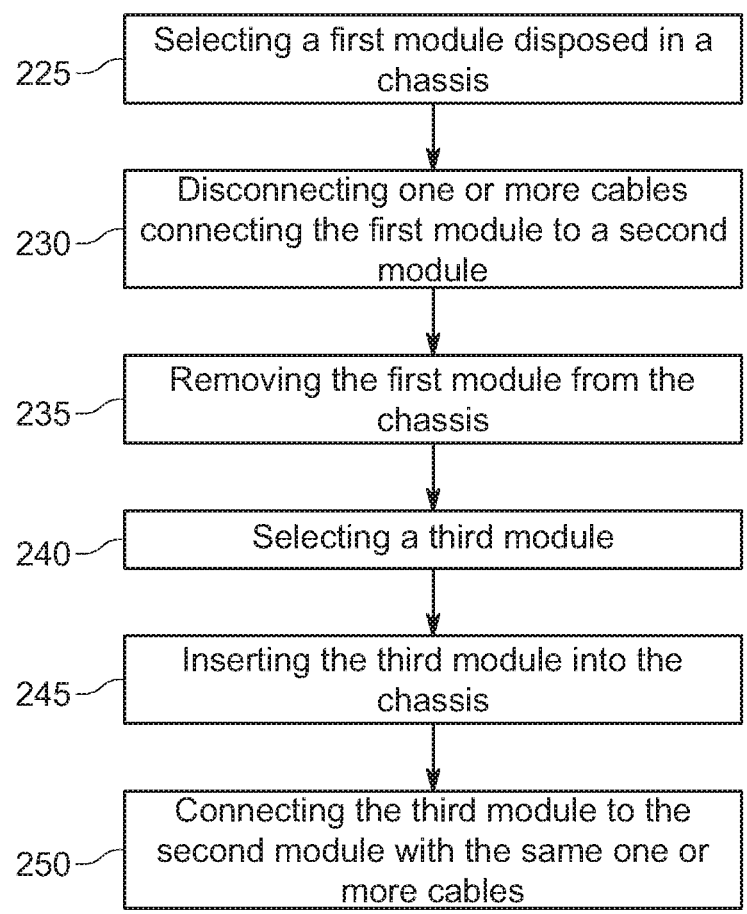
FIG. 8 is a block diagram of a method of modularly exchanging compute platform components in accordance with one or more example embodiments.

Referring to FIG. 8, a block diagram of a method of modularly exchanging compute platform components according to an example embodiment is shown. As explained above, compute platforms according to implementations disclosed herein may include a first module, a second module, and a third module. The first module may provide a processing subsystem that includes an ASIC. In certain implementations, first module may include memory and/or one or more processors. Accordingly, the first module may be a central processing unit, switch, buffer, retimer, or the like. Second module may provide management and input/output devices that are connected to the first module through cables. Third module may provide media devices used to store data that are connected to the first module through cables.

In order to exchange components within the modular compute platform, a user may initially select (225) a first module disposed in the enclosure of the compute platform. The selection (225) of the first module may be determined based on requirements of the compute platform. For example, first module may be selected (225) based on the need to replace the processing subsystem to take advantage of new technologies, such as processers or memory providing higher speeds. First module may also be selected (225) to migrate the processing subsystem to a different type of processor or memory, such as a processing subsystem of a different manufacturer. Additionally, first module may be selected (225) to replace damaged components or replace components that are not functioning as desired. The selection (225) may occur as part of compute platform redesign, updates, after fault analysis, or through general maintenance.

After the first module is selected (225), a user may disconnect (230) a first cable connecting the first module to a component of the second module. Because the first, module and components of the second module are physically separate disconnecting (230) the first cable allows the user access to the first module without also removing components of the second module.

The first module may then be removed (235) from the enclosure. Because components of second module are not disposed on the printed circuit board of the processing subsystem of the first module, the first module is separated from components of the second module and the components may remain in the enclosure.

After the first module is removed (235) from the enclosure, the user may select (240) a third module, where the third module includes an ASIC. In certain implementations, third module may include components of a processing subsystem, such as a processor and memory. The selection (240) of the third module may be based on any of the factors identified above with respect to the selection (225) of the first module. For example, third module may have a processor or memory that is faster than those of first module. In other implementations, third module may include components from a different manufacturer. In still other implementations, third module may have a different number of processors, a different amount of memory, or otherwise provide components that improve the functionality of the compute platform.

The third module may then be inserted (245) into the enclosure. Because the form factor of the third module matches that of the first module, thereby providing common connections and mounting locations, the third module may be interchanged for first module. After the third module is inserted (245) and/or otherwise installed within the enclosure, the third module may be connected (250) to the second module with the first cable. Accordingly, the processing subsystem of the compute platform may be replaced without replacing management, input/output, and or media components.

In certain implementations, before removing (235) the first module from the enclosure, a user may disconnect a second cable connecting the first module to a fourth module disposed in the enclosure. In this implementation, the fourth module may include a media device. Thus, prior to removing first module, the user may remove the first and second cables from the first module. Similarly, after the third module is inserted and installed, a user may reconnect the first and second cables, thereby connecting third module to both first and fourth modules.

In other implementations, a user may replace a component of the second module. In such an implementation, the user may disconnect a first cable connecting the component in the second module to the first module. For example, in one implementation a user may determine that in order to increase speeds, a new PCIE slot is required. Accordingly, the user would disconnect the old PCIE slot from the first module, remove the old PCIE slot and then install a new PCIE slot in its place. After the PCIE slot is installed, the user may then connect the cable from the first module to the new PCIE slot. Those of skill in the art having benefit of this disclosure will appreciate that this technique for replacing components with new or different components may include any type of management and/or input/output devices used in compute platforms.

In other implementations, an optical transceiver may be inserted into the second module. In such an implementation the optical transceiver may be installed on a proximate, distal, or side of the enclosure, thereby allowing an optical port to be accessible by a user. The optical transceiver may then be connected to the first module either directly or indirectly through an optical cable. In a direct connection, the optical cable may connect the processing subsystem directly to the optical transceiver. In an indirect connection, the optical cable may connect the optical transceiver to an optical connection, where the optical connection is independent from first module. In such an indirect connection, the optical connection is connected to the first module, and thus the processing subsystem through a wired connection, such as those discussed above. Similarly, an electrical cable may be attached to the first module and carry signals to an electrical connection in the second module, which may be accessed externally by a user. Accordingly, a user may access information from the first module via the second module without connecting directly to the first module.

Figure 9:
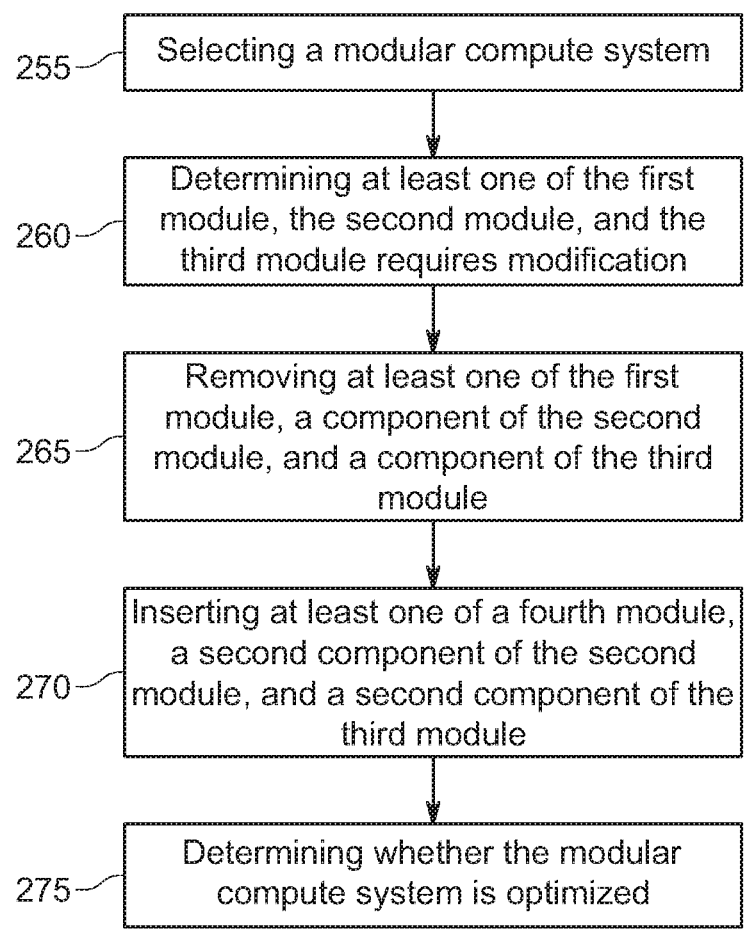
FIG. 9 is a block diagram of a method of optimizing modular compute platforms in accordance with one or more example embodiments.

Referring to FIG. 9, a block diagram of a method of optimizing modular compute platforms according to an example embodiment is shown. In this method, a user may select (255) a modular compute platform having a first module having an ASIC, a second module having an input/output device, and a third module having a media device. In certain implementations, first module may further include a processor and/or memory element and second module may further include various management devices. First, module may further function as either a processing subsystem, a switch, a buffer, a retimer, or a memory only device.

After the modular compute platform is selected (255), a user may determine (260) that at least one of the first module, the second module, and the third module requires modification based on an optimization parameter. The optimization parameter may include various factors that may be used to determine the functionality of the compute platform. Examples of optimization parameters may include, but are not limited to, a signal speed, a processing speed, a signal loss, a power factor, a heat factor, a technology factor, an efficiency factor, a reliability factor, a cost factor, a reuse factor, and an environmental factor.

Signal speeds and processing speeds may be determined based on the speeds of particular components within first module, second module, and third module. Signal loss may be determined by calculating the loss over a particular trace or cable or may be determined by calculating loss between two or more components within first module, second module, and/or third module. A power factor may be determined based on the amount of power required to run one or more components or modules within compute platform. A heat factor may be determined by measuring or calculating heat generated by particular components, modules, or by the compute platform in part or total. Heat factor may also take into consideration components such as fans, liquid cooling, or other cooling devices, as well as the operability of subcomponents, such as heatsinks and the like.

A technology factor may include the impact of new technology that provides greater functionality than existing components provide. An efficiency factor may include consideration of how efficient a compute platform is operating compared to the relative increase in efficiency that may occur by replacing a module or a component of a module. A reliability factor may consider the uptime of a compute platform compared to potential uptime due to replacing a module or a component of a module. A cost factor may take into consideration the costs associated with replacing a component or module versus replacing an entire compute platform. A reuse factor may include the ability to reuse particular components or replace only components that require replacement or updating without having the replace the entire compute platform. An environmental factor may include consideration of the impact on the environment by decreasing waste caused by replacing more than individual components. For example, replacing an entire compute platform generates more waste than an individual component.

In certain implementations, the optimization parameter may include other variables not specifically identified above. Those of skill in the art having benefit of the present disclosure will appreciate that any factor influencing compute platform operability may be considered when determined whether a module or component of a module requires modification. The determination may further include analysis based on new or previously collected or simulated data that weighs optimization parameters to determine compute platform performance. For example, data may be collected through fault analysis, software-based simulations, or through onboard analysis, such as receiving data through an optical transceiver connected to the first module, as described above.

After a user determines (260) that at least one of the first module, the second module, and/or the third module requires modification based on the optimization parameter, the user may remove (265) at least one of the first module, a component of the second module, and/or a component of the third module. In certain implementations, an entire second module or third module may also be replaced. In other implementations, a user may determine that removal (265) of a device is not required. In such a situation, a new device or component may be added to the compute platform without removing an existing component or device.

After the module or component of a module is removed (265), a user may insert (270) at least one of a fourth module having a second ASIC that replaces the first module. The first and fourth modules are interchangeable at least in part because of one or more common connection locations and common mounting locations, as discussed in detail above. In certain implementations, first and fourth modules may include memory, while in other implementations first and fourth modules may include memory and a processor.

In examples where the first module is not removed (265) and replaced, a second component of the second module or a second component of the third module may be removed (265) and replaced. For example, a new management or input/output device may be inserted into second module or a new media device may be added or replaced in third module.

After the compute platform has been modified, as explained above, a user may determine (275) wither the modular compute platform is optimized based on the optimization parameter. The determination (275) may take into consideration overall performance changes to the compute platform. If the user determines (275) the compute platform is optimized, the user may place the compute platform back into operation. If the user determines (275) the compute platform is not optimized, the user may continue the process above iteratively until the compute platform is optimized.

As used herein, the term optimization takes into consideration the performance of the compute platform based on one or more parameters, such as those listed above. In certain implementations optimization may only take into consideration a single parameter. For example, a user may only be concerned with the speed of a device. As such, optimization may be achieved by addition or replacement of a module or component regardless of whether the component had negative effects on other parameters. For example, a component may be added that increases speed, but also increases heat generated. Optimization may be achieved because the heat factor is less important than the speed parameter.

In other situations, a user may optimize a compute platform based on the relative weight of more than one parameter. For example, a user may weigh a cost savings against a speed gain. In such a situation, a slower speed may be selected to save cost. In other implementations, optimization may take into consideration total compute platform performance based on more than two optimization parameters.

As a part of optimizing a compute platform, a user may further perform simulations of the compute platform functionality. In such simulations, the user may determine the functionality of the compute platform with the original modules and components. The functionality may be determined by measuring values of the compute platform in operation, reviewing fault analysis or other previously generated metrics, or calculating theoretical operational functionality based on or not based on empirical evidence. This data may be referred to as original modular compute platform functionality data.

The user may then determine the functionality of the modular compute platform with a fourth module, a new or replacement second component of the second module, and/ or a new or replacement second component of the third module. This determination may be performed through software-based simulations where one or more optimization parameters are analyzed. The simulations may thereby generate simulation data based on the projected functionality of the new module or new or replacement components of the second and/or third modules.

After simulation data is generated, the simulation data for the new or replacement module or components may be compared to the original modular compute platform functionality data. The comparison may include weighing the one or more optimization parameters to determine whether to modify the compute platform.

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

While the present teachings have been described in conjunction with various examples, it is not intended that the present teachings be limited to such examples. The above-described examples may be implemented in any of numerous ways.

Also, the technology described herein may be embodied as a method, of which at least one example has been provided. The acts performed as part of the method may be ordered in any suitable way. Accordingly, examples may be constructed in which acts are performed in an order different than illustrated, which may include performing some acts simultaneously, even though shown as sequential acts in illustrative examples.

Advantages of one or more example embodiments may include one or more of the following:

In one or more examples, systems and methods disclosed herein may be used to increase compute platform performance through modularly exchanging components within the platform.

In one or more examples, systems and methods disclosed herein may be used to optimize compute platform performance based on one or more optimization parameters.

In one or more examples, systems and methods disclosed herein may be used to adapt existing compute platforms to emerging, technology without requiring replacement of the entire compute platform.

Not all embodiments will necessarily manifest all these advantages. To the extent that various embodiments may manifest one or more of these advantages, not all of them will do so to the same degree.

While the claimed subject matter has been described with respect to the above-noted embodiments, those skilled in the art, having the benefit of this disclosure, will recognize that other embodiments may be devised that are within the scope of claims below as illustrated by the example embodiments disclosed herein. Accordingly, the scope of the protection sought should be limited only by the appended claims.

What is claimed is:

1. A modular compute platform comprising:
   an enclosure;
   a first module including an application specific integrated circuit, the first module being disposed in the enclosure;
   a second module including an input/output device, the second module being disposed in the enclosure, the input/output device connected to the first module through a first cable, wherein the second module further includes an optical connector connected to an optical transceiver via an optical cable, wherein the optical connector is disposed on an outer edge of the second module or the enclosure; and
   a third module comprising a media device disposed in the enclosure, the media device connected to the first module through a second cable;
   wherein the optical transceiver is connected to the first module via an electrical connector, wherein the optical transceiver is disposed adjacent to the first module and proximate to one or more fans of the compute platform for dissipating heat from the optical transceiver.

2. The modular compute platform of claim 1, wherein the first module is interchangeable with a fourth module, the fourth module comprising a second application specific integrated circuit.

3. The module compute platform of claim 2, wherein the first module and the fourth module have at least one common connection location.

4. The modular compute platform of claim 2, wherein the fourth module is connectable to the second module through the first cable and the third module through the second cable.

5. The modular compute platform of claim 1, wherein the input/output device comprises at least one peripheral component interconnect express device connected to the first module through a third cable.

6. The modular compute platform of claim 1, wherein the second module is physically separated from the first module.

7. The module compute platform of claim 1, wherein the first module further comprises a processor.

8. The modular compute platform of claim 1, wherein the first, second, and third modules are disposed adjacent to one another along a length of the enclosure.

9. The modular compute platform of claim 1, wherein the optical connector is disposed on an exterior surface of the enclosure.

10. A method of modularly exchanging compute platform components, the method comprising:
selecting a first module disposed in an enclosure, the first module comprising an application specific integrated circuit;
disconnecting a first cable connecting the first module to a component of a second module disposed in the enclosure, wherein the second module includes an optical connector connected to an optical transceiver via an optical cable, wherein the optical connector is disposed on an outer edge of the second module or the enclosure;
removing the first module from the enclosure;
selecting a third module, the third module comprising a second application specific integrated circuit;
inserting the third module into the enclosure;
connecting the third module to the second module with the first cable;
connecting the third module to a fourth module with a second cable, the fourth module comprising a media device disposed in the enclosure; and
connecting the optical transceiver to the third module via an electrical connector, wherein the optical transceiver is disposed adjacent to the first module and proximate to one or more fans of the compute platform for dissipating heat from the optical transceiver.

11. The method of claim 10, further comprising disconnecting the second cable connecting the first module to the fourth module.

12. The method of claim 10, further comprising removing the component from the second module and replacing the component with a second component.

13. The method of claim 10, wherein the optical connector is disposed on an exterior surface of the enclosure.

14. A method of optimizing modular compute platforms, the method comprising:
selecting a modular compute platform comprising a first module having an application specific integrated circuit, a second module having an input/output device, and a third module having a media device, wherein the second module further includes an optical connector connected to the optical transceiver via an optical cable, and wherein the optical transceiver is connected to the first module via an electrical connector, and wherein the optical connector is disposed on an outer edge of the second module or an enclosure;
determining at least one of the first module, the second module, and the third module requires modification based on an optimization parameter;
inserting at least one of a fourth module having a second application specific integrated circuit to replace the first module, a new component in the second module to replace an old component in the second module, and new component in the third module to replace an old component in the third module;
determining whether the modular compute platform is optimized based on the optimization parameter and at least partially on data received through an optical transceiver connected to the first module, wherein the optical transceiver is disposed adjacent to the first module and proximate to one or more fans of the compute platform for dissipating heat from the optical transceiver; and
simulating the modular compute platform with at least one of the fourth module, the new component in the second module, and the new component in the third module, generating simulation data based on the simulating, and comparing the simulation data to an original modular compute platform functionality data.

15. The method of claim 14, wherein the optimization parameter comprises at least one of a signal speed, a processing speed, a signal loss, a power factor, a heat factor, a technology factor, an efficiency factor, a reliability factor, a cost factor, a reuse factor, and an environmental factor.

16. The method of claim 14, further comprising removing at least one of the first module, the old component in the second module, and the old component in the third module.

17. The method of claim 14, wherein the first module is disposed in the enclosure, the second module is disposed in the enclosure and connected to the first module through a first cable, and the third module is disposed in the enclosure and connected to the first module through a second cable.

18. The method of claim 14, wherein the optical connector is disposed on an exterior surface of the enclosure.

* * * * *